United States Patent
Moll et al.

(10) Patent No.: US 6,949,008 B1
(45) Date of Patent: Sep. 27, 2005

(54) SYSTEM AND METHOD FOR PLANARIZING A SUBSTRATE SURFACE HAVING A NON-PLANAR SURFACE TOPOGRAPHY

(75) Inventors: Nicolas J. Moll, Woodside, CA (US); John Stephen Kofol, Sunnyvale, CA (US); David Thomas Dutton, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/967,973

(22) Filed: Oct. 19, 2004

(51) Int. Cl.[7] ............................................... H01L 21/00
(52) U.S. Cl. ......................................... 451/5; 438/942
(58) Field of Search ............................. 451/5; 716/19; 438/758, 689, 690, 691, 942; 216/40, 41

(56) References Cited

U.S. PATENT DOCUMENTS

| | | | |
|---|---|---|---|
| 6,245,635 B1 * | 6/2001 | Lee | 438/407 |
| 6,381,300 B1 * | 4/2002 | Ezaki | 378/35 |
| 6,848,970 B2 * | 2/2005 | Manens et al. | 451/5 |
| 2002/0164839 A1 * | 11/2002 | Enquist | 438/119 |

* cited by examiner

Primary Examiner—Jacob K. Ackun, Jr.

(57) ABSTRACT

A method for planarizing a substrate surface having a non-planar surface topography comprises forming a material layer over the substrate, the material layer having a surface topography, determining the surface topography of the material layer, and forming a mask using information relating to the surface topography of the material layer. The mask defines portions of averaging regions of the material layer for selective removal to equalize the averaging regions in average height, the averaging regions having a maximum dimension. The material layer is etched using the mask, and a planarizing layer is formed over the substrate surface. The planarizing layer provides a low-pass lateral filtering effect characterized by a length greater than the maximum dimension of the averaging region. The mask is created by determining the localized height of the material layer across a surface and using the mask to etch away corresponding portions of the material layer so that the average surface of the material layer approximates a planar surface. The surface of the second material layer is substantially planar. The system and method for planarizing a material layer provides for forming a substantially planar layer of material over a non-planar topography.

25 Claims, 9 Drawing Sheets

SYSTEM AND METHOD FOR PLANARIZING A SUBSTRATE SURFACE HAVING A NON-PLANAR SURFACE TOPOGRAPHY

BACKGROUND OF THE INVENTION

Many electronic devices are fabricated by forming layers of material over other layers of material, or over electronic components formed over a substrate. For example, a semiconductor light emitting device, such as a light emitting diode or a laser, can be fabricated by forming epitaxial layers of material over a substrate. In another example, an integrated circuit is formed from a number of layers formed on a substrate. The material layers include layers of semiconductor material, dielectric material, contact material, etc.

In one fabrication technique, thin layers of material are applied by dissolving a solid in a solvent, thus forming a solution, and then spinning the solution onto a surface. Typically, after spinning, the solvent is removed by, for example, mechanical inertia or evaporation, leaving a thin layer of the solid material as layer of the device. Other methods for applying material layers also exist.

In many cases the substrate surface on which the solid layer of material is formed is not planar. Typically, the substrate surface has a non-planar surface topography. For example, if the device is an integrated circuit, the substrate surface topography is characterized by the shapes of circuit elements having differing heights, profiles and areas. The surface of a layer of material applied over such a substrate surface of non-planar topography will typically have a topography that conforms, at least to some degree, to the topography of the substrate surface. A comparison of the 2-dimensional spatial Fourier transforms of the substrate surface topography and the applied material layer reveals that the surface topography of the applied layer has a spatial spectrum that is somewhat attenuated at high frequencies compared to the spectral density of the underlying surface, but otherwise generally conforms to the surface topography of the underlying surface.

However, in some applications, such as in semiconductor manufacturing, it is desirable that the surface of an applied material exhibit a substantially planar surface.

Several prior techniques have been used in an attempt to planarize a material layer formed over a non-planar substrate surface. In one method, the physical properties of the solution applied over the non-planar substrate surface, such as viscosity, density, and molecular weight of the solids in the solution, are designed to reduce the high-frequency spectral content of the 2-D Fourier transform of the surface topography of the applied layer. This technique is effective at planarizing the surface of a layer applied over a non-planar substrate surface if the surface topography of the substrate surface has no spatial frequency components below the cut-off frequency of the low-pass filtering effect of the spun-on solution.

Another prior technique for planarizing a substrate surface having a non-planar topography applies multiple layers, optionally solidifying each layer prior to forming the following layer. The multiple layers can be etched to reduce their thickness. Unfortunately, this technique suffers from the same shortcomings as described above.

A third prior technique attempts to planarize the spun-on layer by using gravitational effects and/or the surface tension properties of the solution by minimizing the viscosity of the solution after it has been spun onto the substrate surface. However, this technique also suffers from the above-described shortcomings.

In a fourth prior technique, a surface of an applied layer is planarized using chemical-mechanical polishing. Unfortunately, it is difficult to remove a precise amount of material and this technique often abrades the substrate surface, thereby damaging the substrate surface.

SUMMARY OF THE INVENTION

In one embodiment, the invention is a method for planarizing a substrate surface having a non-planar surface topography, the method comprising forming a material layer over the substrate, the material layer having a surface topography, determining the surface topography of the material layer, and forming a mask using information relating to the surface topography of the material layer. The mask defines portions of averaging regions of the material layer for selective removal to equalize the averaging regions in average height, the averaging regions having a maximum dimension. The material layer is etched using the mask, and a planarizing layer is formed over the substrate surface. The planarizing layer provides a low-pass lateral filtering effect characterized by a length greater than the maximum dimension of the averaging region. The mask is created by determining the localized height of the material layer across a surface and using the mask to etch away corresponding portions of the material layer so that the average surface of the material layer approximates a planar surface. The surface of the second material layer is substantially planar. The system and method for planarizing a material layer provides for forming a substantially planar layer of material over a non-planar topography.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Although the embodiments of the system and method for planarizing a material layer will be described in the context of applying a dielectric material layer over an integrated circuit, the system and method for planarizing a material layer is applicable to any system or process in which it is desirable to form a material layer having a substantially planar surface over a non-planar surface.

A planarizing layer has the ability to form a planar surface over topographical features smaller than a planarizing material-dependent critical dimension, referred to below as the characteristic length, but loses this ability as this dimension is exceeded. Thus, in accordance with an embodiment of the invention, a material layer is applied to a non-planar substrate surface. The material layer also has a non-planar surface topography as a result of the non-planar surface topography of the substrate. The surface topography of the material layer is then modified to one that is non-planar in averaging regions having dimensions smaller than the critical dimension, but is planar when averaged over the averaging regions. The on-average planar surface of the material layer causes the surface of a planarizing layer applied to the surface of the material layer to be planar.

Figure 1A:
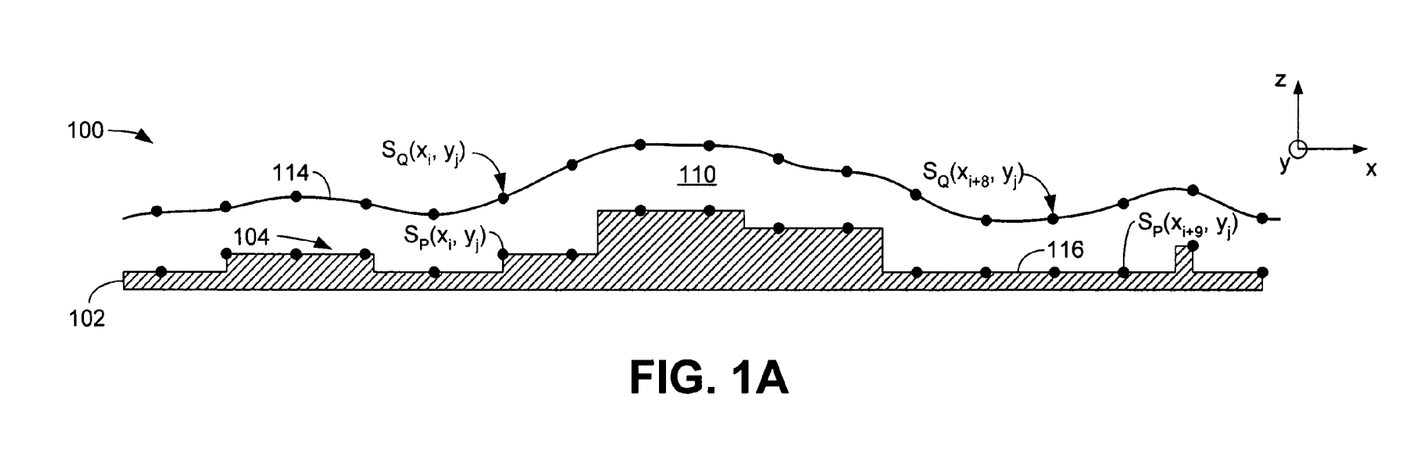
FIGS. 1A, 1B and 1C are schematic diagrams collectively illustrating an embodiment of the invention.
Figure 1B:
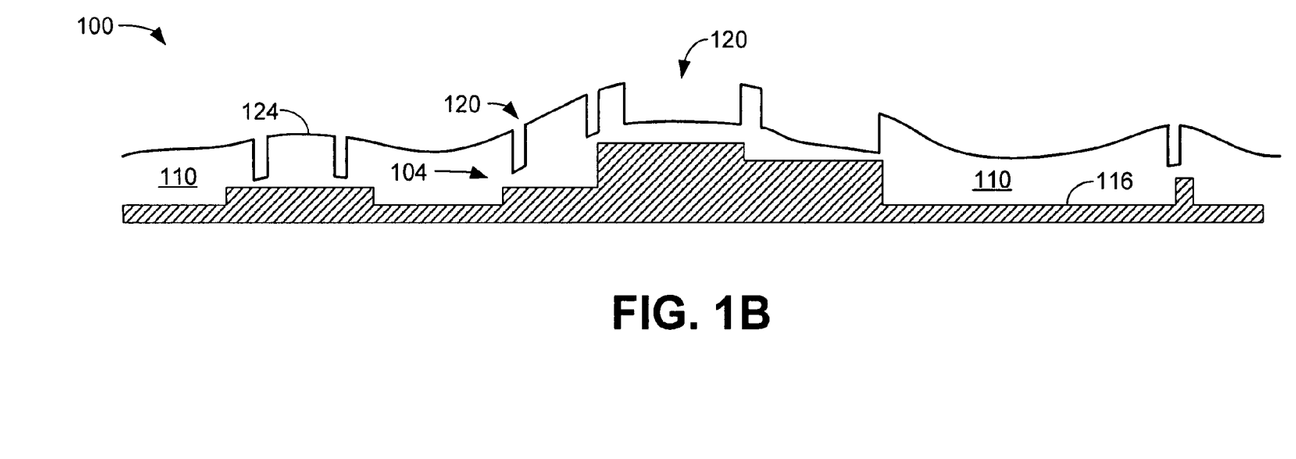
Figure 1C:
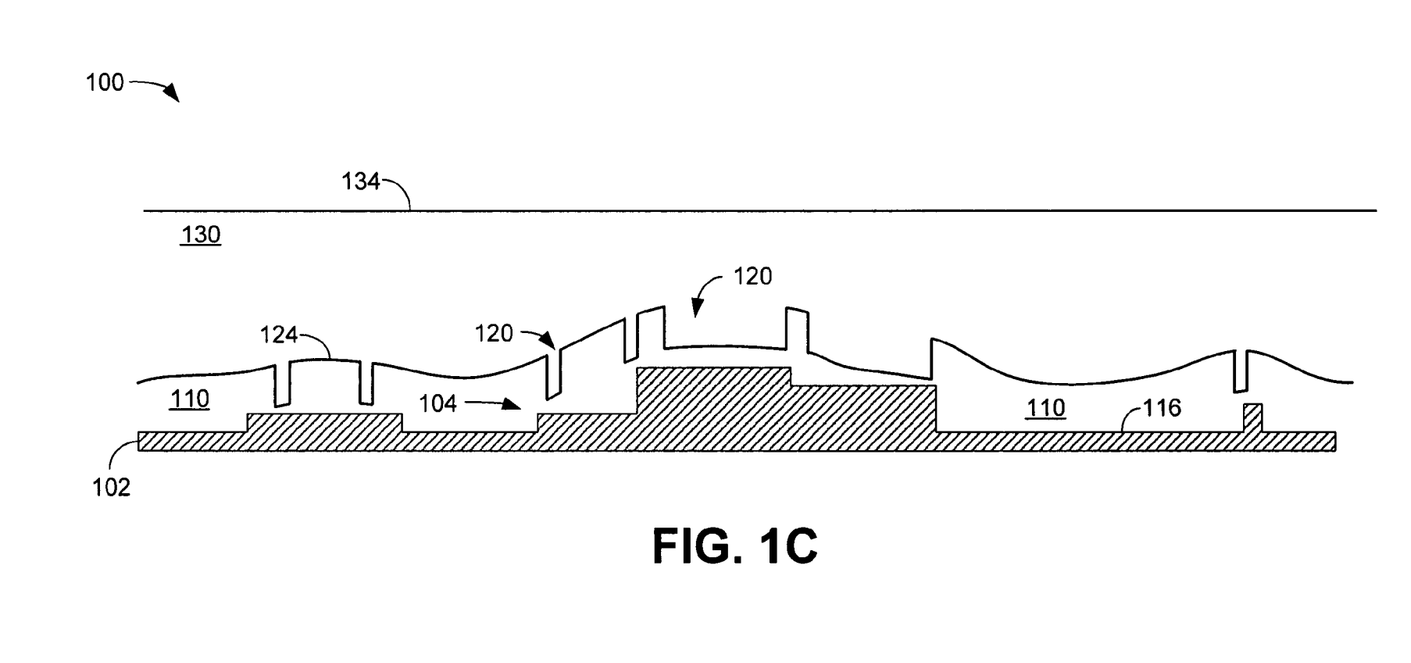

FIGS. 1A, 1B and 1C are schematic diagrams collectively illustrating an embodiment of the invention. FIG. 1A shows a portion of a semiconductor device 100. The portion of the semiconductor device 100 includes circuitry 102 and has a substrate surface topography indicated using reference numeral 104. The circuitry 102 can be composed of, for example, one or more layers of semiconductor material that have been processed by such processes as depositing, etching, etc. to form a surface topography 104. A first applied layer (also referred to as a "patterning layer") 110 is applied over the circuitry 102. For example, as known in the art, the patterning layer 110 is a dielectric material, such as a plastic, that is "spun" onto the surface of the substrate as known in the art. In this example, the circuitry 102 is formed on a "wafer" (not shown). The first applied layer can be, for example, benzocyclobutene polymer, also referred to as "BCB."

In accordance with an embodiment of the invention, the surface topography 114 of the patterning layer 110 conforms in a predictable manner to the surface topography 104 of the circuitry 102. In many contemporary semiconductor manufacturing techniques, data describing the surface topography 104 of the circuitry 102 is available to the designers of the semiconductor device 100. For example, when creating microstructures on semiconductor wafers, complex surface topographies having intricate patterns are created by sequentially etching the surface, depositing materials on the surface, and/or chemically reacting with the surface of the wafer through a series of masks applied to the surface, and patterning by lithographic techniques. The processes of etching, depositing and reacting are usually very tightly controlled, and the various effects upon the topography of the underlying surface are, therefore, highly predictable. In contemporary semiconductor manufacturing techniques, the lithographic patterns used for each masking step are usually described by data files that are stored in a computing device. According to understood practices, the surface topography 104 of the circuitry 102 may be directly computed to high precision based upon the data files describing the lithographic patterns and upon the knowledge and control of the processes applied to that surface. Accordingly, by knowing the specific details of the surface topography 104, it is generally a straight-forward matter to construct a mathematical model that defines the surface topography 114 of the patterning layer 110. The model that has been used when BCB is used as the patterning layer 110 is based upon a two-dimensional linear transformation of the underlying surface. Similarly, models likely exist for a wide variety of different materials used to form an applied layer.

When the patterning layer 110 is applied by spinning a polymer dissolved in solvent onto a surface, the surface topography 114 of the patterning layer 110 can be predicted, to a very close approximation, by applying a linear, spatially invariant, orientation invariant, two-dimensional filter to the surface topography 104 of the underlying surface 102. Further, as will be described below, a two-dimensional impulse response of the above-mentioned two dimensional filter can typically be adequately determined by measuring, in one dimension, the surface topography of an exemplary patterning layer where it covers a step in the topography of the underlying surface.

As mentioned above, a mathematical model exists for predicting the surface topography 114 of the patterning layer 110, based upon knowledge of the surface topography 104 of the underlying surface and the properties of the material applied to form the patterning layer. Because an accurate mathematical description of the surface topography 104 exists, it is possible to compute (or otherwise determine) the surface topography 114 of the patterning layer 110.

Figure 4:
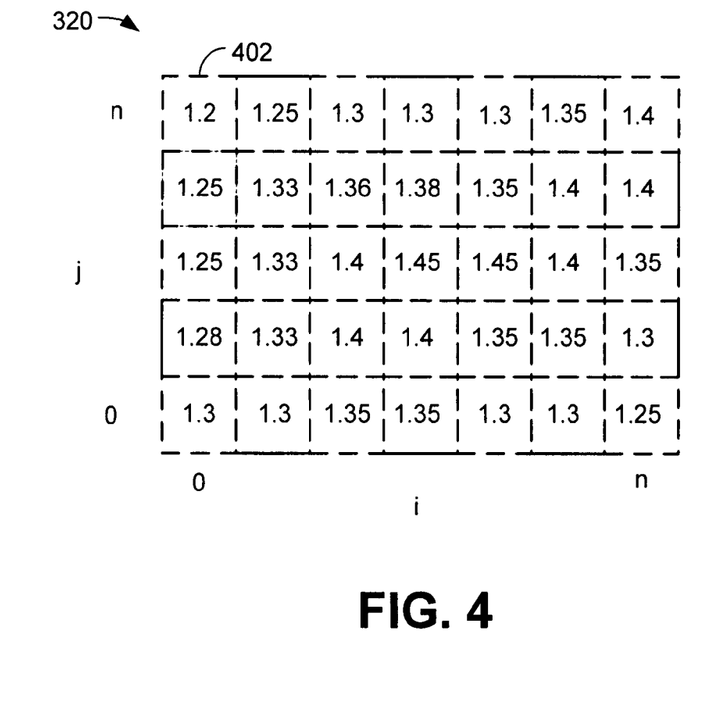
FIG. 4 is a schematic diagram illustrating a portion of one of the reticles of FIG. 3.

FIG. 4 is a schematic diagram illustrating, as a matrix, the localized height, with respect to the original planar semiconductor surface 116 (FIG. 1A) prior to addition of the circuitry, of the patterning layer 110 shown in FIG. 1A. A semiconductor wafer is divided into what are referred to as reticles. FIG. 4 shows a reticle portion 320 that is further divided into a 7×5 rectangular matrix of 8 micrometer ($\mu$m)×8 $\mu$m regions, an exemplary one of which is illustrated using reference numeral 402. The regions are referred to as averaging regions. In this example, the overall dimension of the reticle portion 320 is 56 $\mu$m×40 $\mu$m. Each 8 $\mu$m×8 $\mu$m averaging region 402 lists the average height ($S_Q(x_i, y_j)$ in FIG. 1A) of the patterning layer 110 in that particular region with respect to the original planar semiconductor surface 116 prior to addition of the circuitry. For example, the average height of the patterning layer 110 (prior to etching) in the averaging region 402 is 1.2 $\mu$m.

The material of the planarizing layer has a planarizing effect characterized by characteristic length. The patterning layer 110 is modified to equalize the height of the averaging regions 402. The averaging regions 402 have a dimension less than the characteristic length. The planarizing effect of the planarizing layer is isotropic, thus leading to a circular averaging region having a diameter less than the characteristic length. However, in practice, a rectilinear averaging region is likely preferred. Therefore, the maximum diagonal dimension of the averaging region 402 should be less that the characteristic length.

The mathematical method used in this embodiment to compute the surface topography 114 from the surface topography 104 of the substrate surface may be described as a two-dimensional finite impulse response (FIR) linear filter applied to the surface topography 104. The height of the surface topography 104 is represented by the function $S_p(x_i, y_j)$ at discrete, evenly-spaced points, $x_i$ and $y_j$, on the semiconductor surface 116 shown in FIG. 1A. Although shown in profile in FIG. 1A, the points $x_i$, and $y_j$ are taken over the surface of the semiconductor device 100.

The variable "x" is the rectilinear coordinate looking left to right across the drawing, and the variable "y" is the rectilinear coordinate perpendicular to the "x" coordinate, but out of the plane of the drawing. The points represented by $x_i$ and $y_j$ are chosen to correspond to the center of each of the averaging regions that will be used to form the etch mask to be described below. Each averaging region has one point $(x_i, y_j)$ associated with it. The indices i and j are integer indices. As will be described below, the "i" index advances by unity looking from left to right of FIG. 4 from one column of regions to the next, and the "j" index advances by unity looking from the bottom to the top of FIG. 4 from one row of regions to the next. Therefore, each value, $S_p(x_i, y_j)$, represents the average height of surface 104 in each averaging region. Similarly, each value, $S_Q(X_j, y_j)$ represents the average height of surface 114 in each averaging region shown in FIG. 4. For example, the number "1.2" that appears in averaging region 402 of FIG. 4 is $S_Q(x_i, y_j)$ for that region.

Note that the points on the surface 104 indicated as $S_p(x_i, y_j)$ need not always lie exactly on the surface 104. This is because these points represent the average height of the surface in the averaging region that is associated with each point. It should be mentioned that other methods (either computational or measurement) that determine the surface topography 114 may be used.

In this embodiment, the height of the patterning layer 110 is computed as $S_Q(x_i, y_j)$ at discrete points, $x_i$ and $y_j$, according to:

$$S_Q(x_i, y_j) = \sum_m \sum_n S_p(u_m, v_n) H((x_i - u_m), (y_j - v_n)) + T \quad \text{Equation 1}$$

where $H(x_i, y_j)$ is the discrete finite impulse response, and T is the nominal thickness of the applied patterning layer 110. The finite impulse response is non-zero for only a finite number of the discrete values $x_i$ and $y_j$.

In FIG. 1B, the surface of the patterning layer 110 has been etched to form wells 120 in the surface topography of the patterning layer 110, resulting in a new surface topography 124. The locations of the wells 120 are defined by a photolithographic mask that is applied to the surface of the patterning layer 110 (FIG. 1A). A depth-controlled etchant is introduced through the mask to form wells 120. The wells 120 are etched to a uniform depth, while the spacing and linear dimensions of the wells 120 are determined by the mask, the formation of which will be described below.

Figures 2, 3:
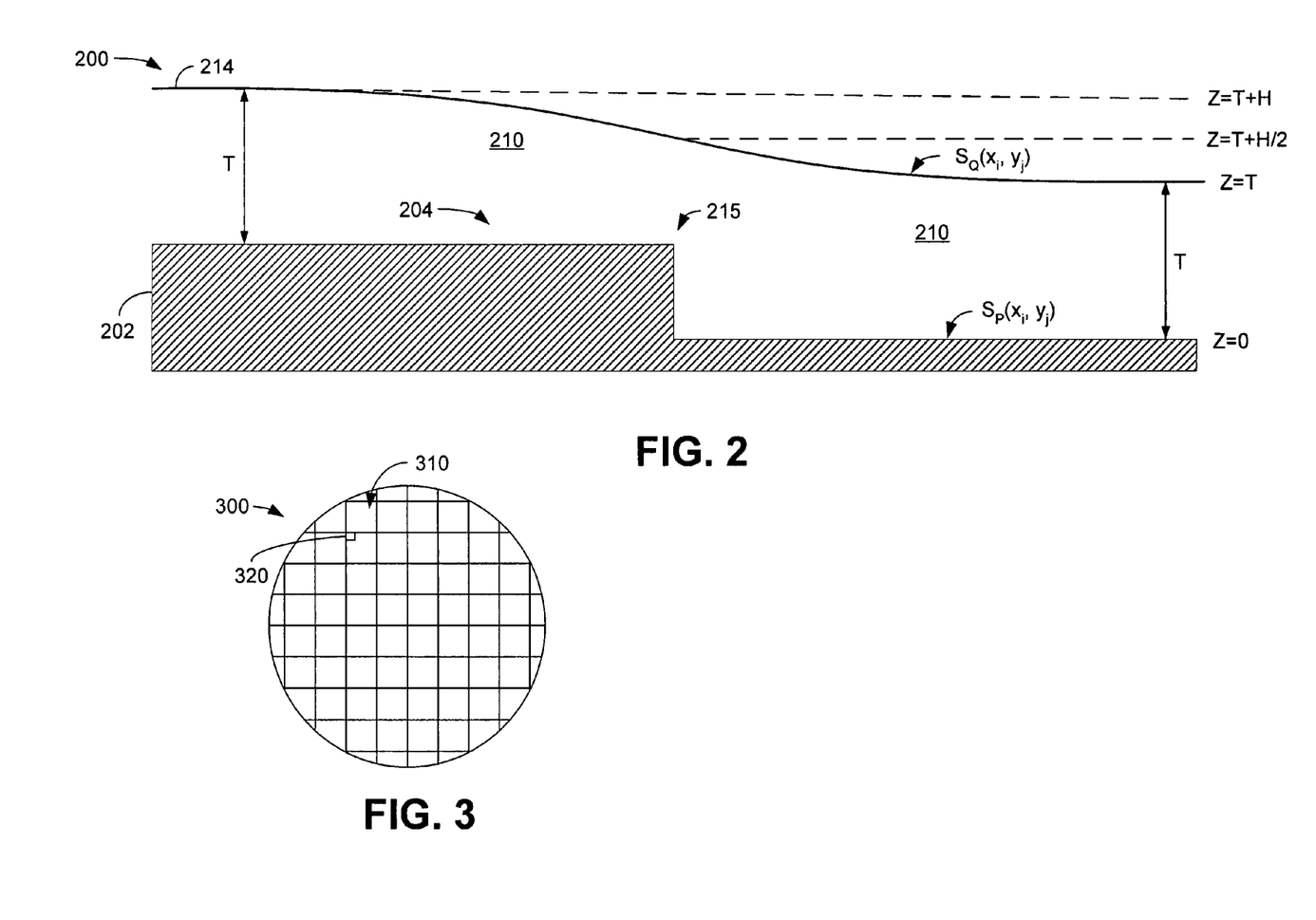
FIG. 2 is a schematic diagram illustrating the manner in which the surface topography of a patterning layer is determined from the surface topography of an underlying structure.
FIG. 3 is a plan view illustrating a semiconductor wafer.

FIG. 2 is a schematic diagram illustrating how the surface topography of the patterning layer is determined from the surface topography of an underlying structure. The finite impulse response, $H(x_i, y_j)$, is determined in this example wherein a patterning layer 210 is applied to the underlying surface 202 having a surface topography 204 including a single step 215. The height of the surface topography 204 and the thickness, T, of the patterning layer 210 are measured. The height of the surface 214 of the patterning layer 210 is also measured as a function of distance (in the example shown) as it covers the step 215, and a particular function, $H(x_i, y_j)$, is determined such that the Equation 1 above adequately reproduces the measured shape of surface 214 as the computed value $S_Q(X_i, y_j)$ when the underlying surface 204 is represented by $S_p(x_i, y_j)$. In this embodiment, the function $H(x_i, y_j)$ has the form:

$$H(x_i, y_i) = A * \left[1 + \cos\left(\frac{\pi * \sqrt{(x_i^2 + y_j^2)}}{r_o}\right)\right]^M \text{ for } x_i^2 + y_j^2 \leq r_o \quad \text{Equation 2}$$

and $$H(x_i, y_j) = 0 \text{ for } x_i^2 + y_j^2 > r_o \quad \text{Equation 3}$$

where A, M and $r_0$ are constants and the values are chosen for A, M, and $r_0$, so that the left-hand side of Equation 1 accurately describes surface 214 when the right-hand side of Equation 1 has been determined by substituting Equations 2 and 3 plus the measured values $Sp(x_i, y_j)$ and T from FIG. 2.

Referring again to FIGS. 1A, 1B and 1C, once the surface topography 114 of the patterning layer 110 is known, a lithographic mask can be created that enables the surface of the patterning layer 110 to be etched resulting in the surface topography 124 shown in FIG. 1B. The surface topography 124, while locally non-planar, is globally planar over the surface of the semiconductor device 100 when the height of the surface topography 124 is averaged over any portion of the surface having a lateral extent greater than the distance that characterizes the low-pass lateral filtering properties (i.e., the characteristic length) of a planarizing layer to be applied subsequently. The surface topography 124, while locally non-planar, is globally planar over the surface of the semiconductor device 100 when the height of the surface topography 124 is averaged over each averaging region 402.

In FIG. 1C, a second applied layer (also referred to as the "planarizing layer") 130 is applied over the surface topography 104 of the circuitry 102. The planarizing layer 130 may be applied directly over the surface of the patterning layer 110, or can be applied indirectly over or above the surface topography 104 of the circuitry 102. The material of the planarizing layer 130 can be the same as the material of the patterning layer 110 or can be a different material than the patterning layer 110. Because the surface topography 124 of the patterning layer 110 is substantially planar when averaged over any portion of the surface having a lateral extent no greater than the characteristic length, the surface 134 of the planarizing layer 130 is substantially planar.

FIG. 3 is a plan view illustrating a semiconductor wafer 300. The semiconductor wafer 300 is typically divided into a plurality of rectilinear sections called reticles, which are repetitively formed in a procedure referred to as "step-and-repeat." An exemplary reticle is illustrated at 310. When a mask, to be described below, is created to etch the patterning layer, as described above, the mask is created for the entire surface of each reticle 310 and duplicated over all of the nominally-identical reticles 310 of the wafer 300. However, as will be described below, a mask covering only a portion 320 of each reticle 310 will be described.

In accordance with an embodiment of the invention, the surface topography 134 (FIG. 1C) of the planarizing layer 130 will be substantially planar. The surface topography 134 of the planarizing layer 130 will have largely suppressed (i.e., low-pass filtered) any short-range non-planarity of the surface of the etched surface 124 of the patterning layer 110. The cut-off lateral frequency of the low-pass filtering effect of the planarizing layer 130 can be associated (via an inverse Fourier transform) with a length and, as in the present example of the surface, with an area. Therefore, the patterning layer 110 is etched to remove material from the patterning layer 110 in strategic locations so that, when the height of the etched surface topography 124 is averaged over an area, the averaged height does not depend upon the location on the wafer 300 of the averaging region 402. A lateral dimension for the area over which the height of the surface topography 124 is averaged is preferably no larger than the characteristic length. In this example, the averaged height of the surface topography 124 is found over each of the averaging regions 402 (FIG. 4) on the wafer 300 (FIG. 3).

Referring again to FIG. 4, the diagonal length of the averaging regions 402 are chosen to be smaller than the characteristic length associated with the planarizing capability of the planarizing layer 130. For example, the 8 μm×8 μm dimension of each averaging region 402 is significantly smaller than the distance, called the "characteristic length," over which the planarizing layer 130 can smooth the surface of the patterning layer 110. In this example, the characteristic length is 80 μm. The numbers located in each of the averaging regions 402 represent the calculated (or measured) height of the surface of the patterning layer 110 averaged over each averaging region 402. The numbers represent the surface height above the original semiconductor surface 116 in FIGS. 1A, 1B and 1C.

Figure 5:
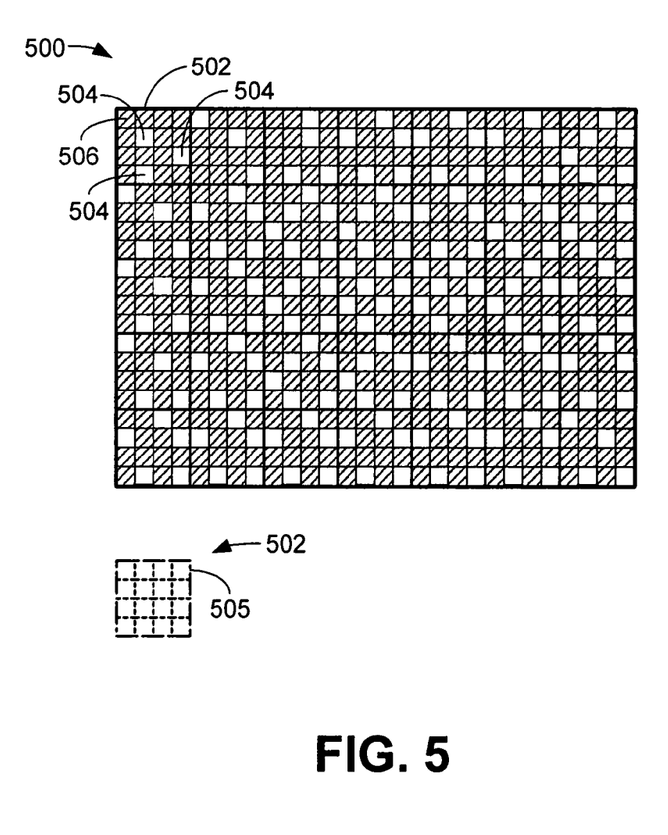
FIG. 5 is a schematic diagram illustrating a mask portion created using information relating to the localized height of the patterning layer as shown in FIG. 4.

FIG. 5 is a schematic diagram illustrating a mask portion 500 created using information relating to the localized height of the patterning layer as shown in FIG. 4. The mask portion 500 is divided into averaging portions 502, where each averaging portion 502 corresponds to an averaging region 402 of FIG. 4. Further, each averaging portion 502 is subdivided into, in this example, sixteen 2 μm×2 μm subportions. An exemplary subportion is indicated at 505. The number of subportions is arbitrary, although a larger number of subportions will typically enhance the planarity of the final surface topography of the planarizing layer. The mask portion 500 can be created by assigning each averaging region's average surface height (FIG. 4) to one of, in this example, 17 evenly spaced bins, ranging from the global minimum surface height (in this example, 1.000 μm) to the global maximum surface height (in this example, 2.000 μm). Thus, each of the 17 bins associated with a respective one of the 17 possible surface heights of averaging portions 502 are shown in Table 1 below.

TABLE 1

| Bin 0: | 1.0 to 1.0588 μm |
|---|---|
| Bin 1: | 1.0588 to 1.118 μm |
| Bin 2: | 1.118 to 1.176 μm |
| Bin 3: | 1.176 to 1.235 μm |
| Bin 4: | 1.235 to 1.294 μm |
| Bin 5: | 1.294 to 1.353 μm |
| Bin 6: | 1.353 to 1.412 μm |
| Bin 7: | 1.412 to 1.471 μm |
| Bin 8: | 1.471 to 1.529 μm |
| Bin 9: | 1.529 to 1.588 μm |
| Bin 10: | 1.588 to 1.647 μm |
| Bin 11: | 1.647 to 1.706 μm |
| Bin 12: | 1.706 to 1.765 μm |
| Bin 13: | 1.765 to 1.823 μm |
| Bin 14: | 1.823 to 1.882 μm |
| Bin 15: | 1.882 to 1.941 μm |
| Bin 16: | 1.941 to 2.0 μm |

Each averaging portion 502 of the mask 500 is created by selectively opening the mask 500 at subportions 505 so that the surface of the patterning layer below the opened subportions 505 is etched.

Figure 6:
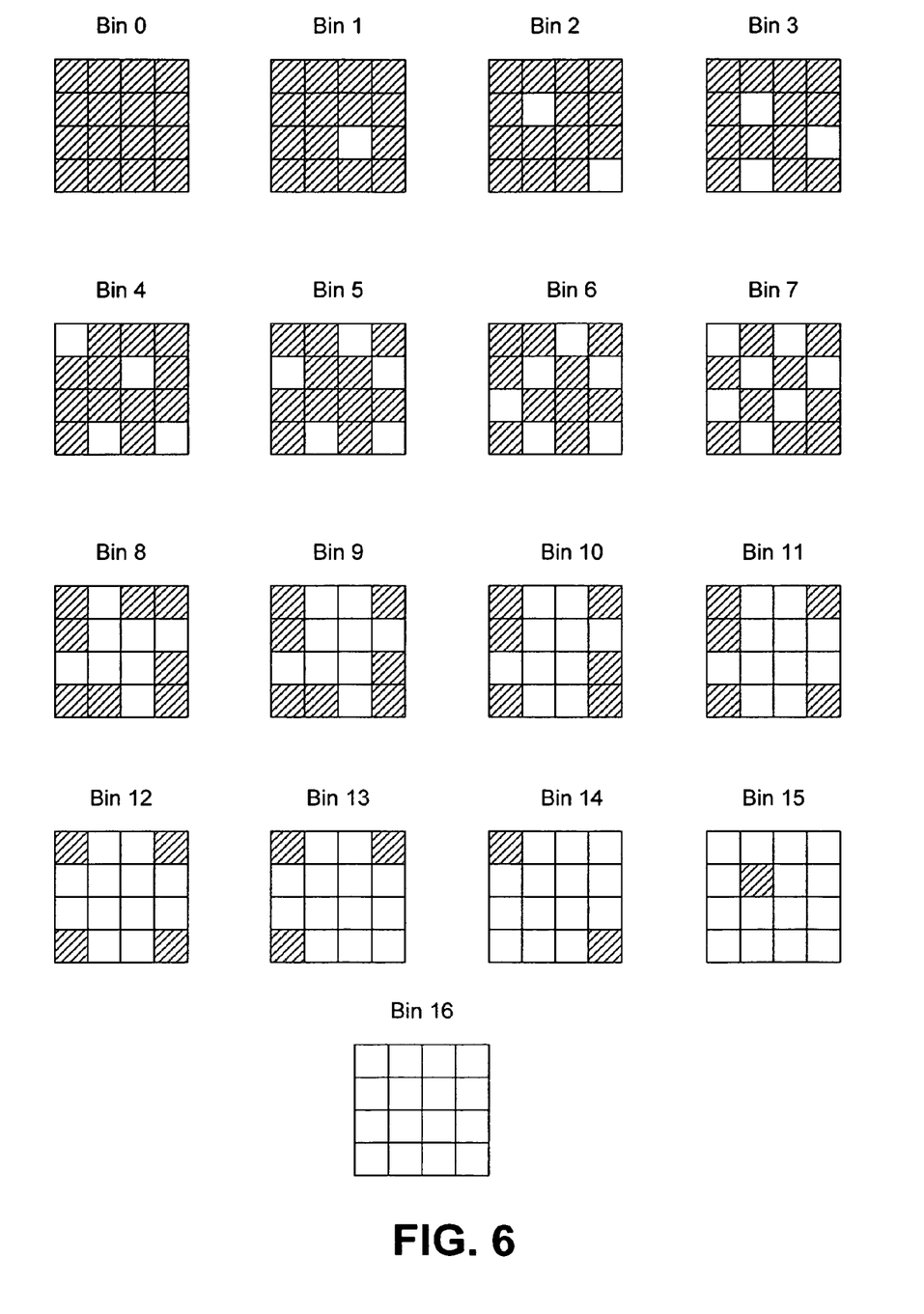
FIG. 6 is a schematic view illustrating one example of a complete set of mask portions corresponding to the bins of Table 1.

FIG. 6 is a schematic view illustrating one example of a possible set of averaging portions 502 corresponding to the bins listed in Table 1. In the etching process, a layer of photo resist is applied over the surface of the patterning layer 110. The photo resist is then exposed according to each averaging portion 502 in the mask 500. The photo resist is then developed and the patterning layer is subject to a constant-depth etch, which etches the patterning layer in the regions exposed by the developed photo resist. In the above example, the etch depth will be chosen as 1.0 μm, such depth being determined by the difference between the height corresponding to the greatest height bin (2.0 μm of bin 16) and the height corresponding to the least-height bin (1.0 μm of bin 0). Optionally, the etch can be continued until the balance of the photo resist is removed. The thickness of the photo resist and the etch conditions are chosen so that the photo-resist is etched away when the desired depth is reached. This eliminates the need to subsequently remove the photo resist.

In this manner, when the mask portion 500 is duplicated over each reticle and is placed over the surface of the patterning layer 110, and a constant depth etch is performed, only the portion of the exposed area corresponding to the amount by which the patterning layer extends beyond the minimum height corresponding to the related portion of the patterning layer 110 will be removed. For example, referring to the averaging region 402 of FIG. 4, the average height of this region is 1.2 μm. Referring now to Table 1, a height of 1.21 μm corresponds to bin 3, so three arbitrarily chosen subportions 505 in the averaging portion 502 are exposed. The desired subportions are indicated using reference numeral 504. In this manner, the average height of the averaging region 402 is reduced to 1.0 μm by the etch reducing the height of the 3 subportions 504 by 1.0 μm. The mask portion 500 is duplicated to cover each reticle 310, on the entire surface of the wafer 300 of FIG. 3. After the surface of the patterning layer 110 is etched using the mask portion 500, the resulting surface topography 124, while being locally non-planar, is substantially planar when averaged over any averaging region 402. In this manner, a planarizing layer 130 applied over the etched patterning layer 120, will be substantially planar.

Figure 7A:
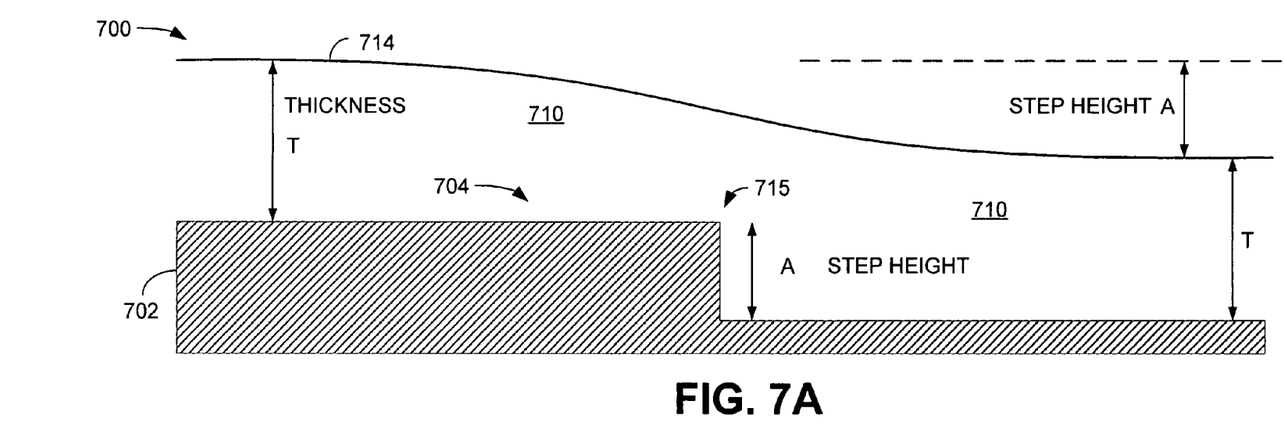
FIGS. 7A, 7B and 7C collectively illustrate an embodiment of the invention where there is a single height differentiation over a large distance of surface area.

FIG. 7A illustrates an embodiment of the invention applicable to a single, one-dimensional step. The substrate 702 is represented by one step 715 in the surface topography 704. In the particular case illustrated by FIG. 7A, the thickness of the patterning layer 710 at the right hand edge of FIG. 7A has reached a limiting thickness, T. Similarly, the thickness of the patterning layer 710 at the left hand edge of FIG. 7A has also reached a limiting thickness, T. It has been observed that patterning layers applied by a spin-on process will achieve the same (or nearly the same) thickness over circuit regions having high topography (such as the left hand side of substrate 702) as over regions having low topography (such as the right hand side of substrate 702) when the thickness of the patterning layer 710 is measured at a distance sufficiently far from any change in the height of the surface topography 704. In the example illustrated in FIG. 7A, the far edges of the surface topography 704 are far enough from the step 715 that the patterning layer 710 has achieved its final thickness, T. A particular consequence of the example illustrated in FIG. 7A is that the maximum height difference between the lowest and highest parts of surface 714 of the patterning layer 710 is the same height, A, as the height of the step 715 in the surface topography 704.

Figure 7B:
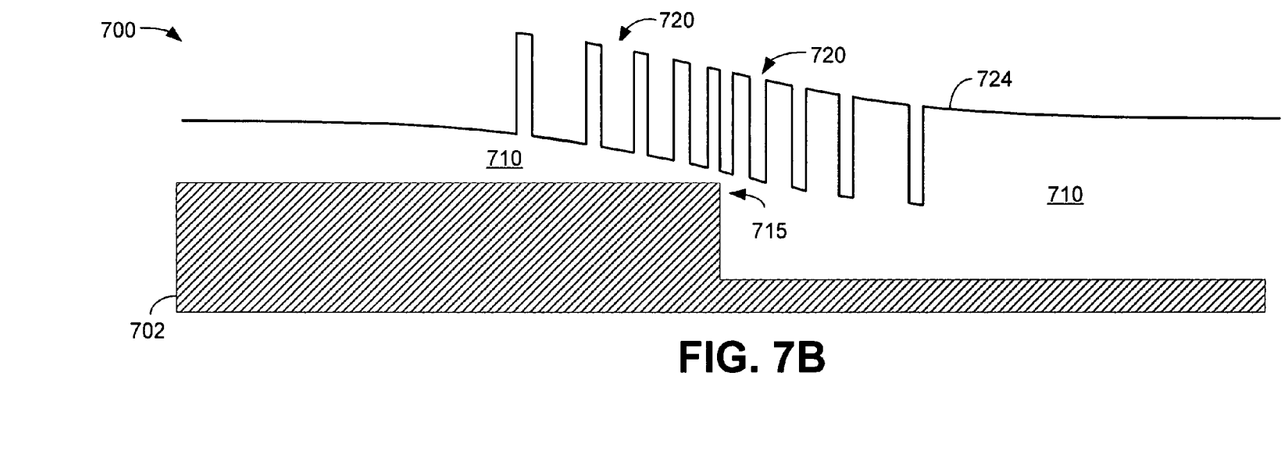

In FIG. 7B, the planarizing layer 710 has been etched resulting in an etched surface topography 724. The depth of the etch is equal to the step height, A. The wells 720 are etched using a mask formed as described above. The etched surface topography 724 of the patterning layer 710 shown in FIG. 7B, while being locally non-planar, is globally planar when averaged over any averaging region 402, each averaging region 402 having a smaller lateral extent than the characteristic length of the planarizing layer to be applied subsequently.

Figure 7C:
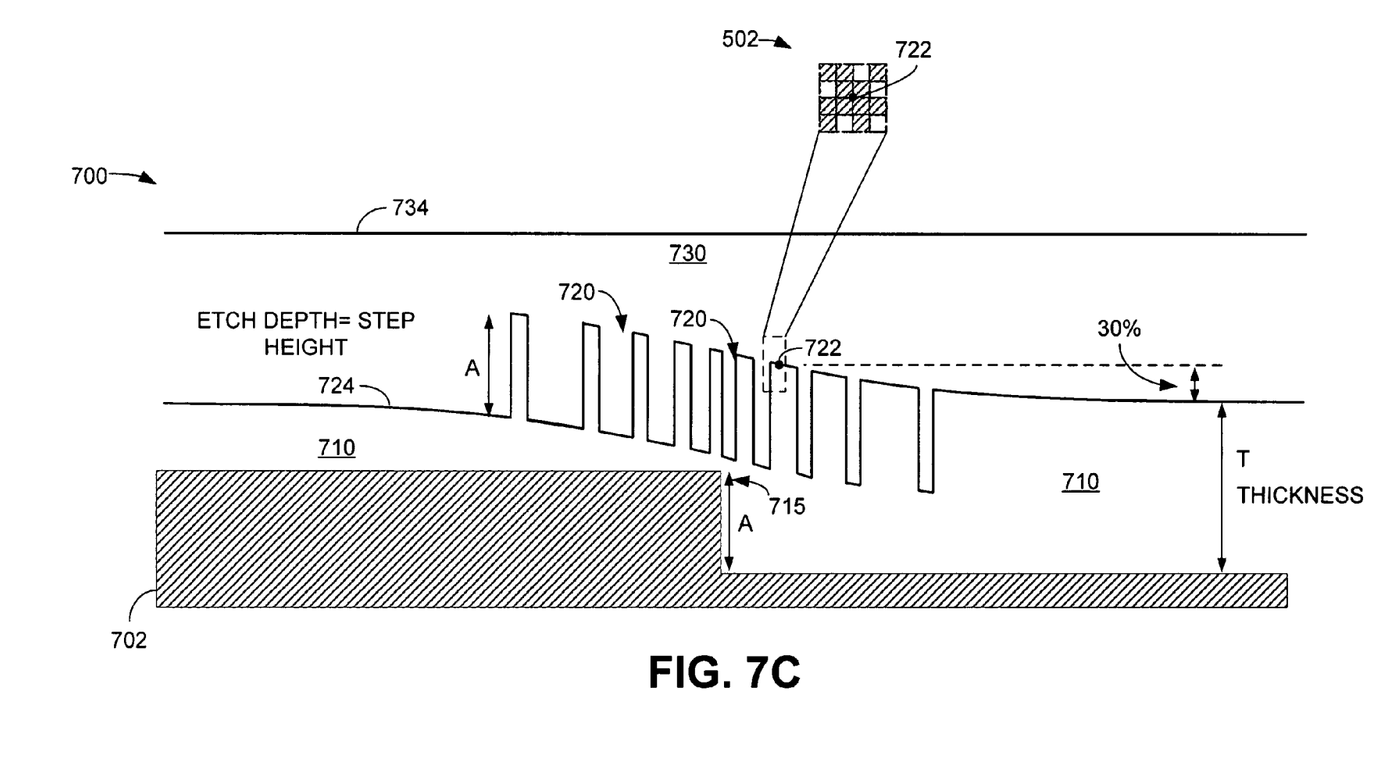

In FIG. 7C, a planarizing layer 730 is applied over the patterning layer 710. The surface topography 734 of the planarizing layer 730 follows the average surface topography 724 (FIG. 7B) of the patterning layer 710, and therefore, closely approximates a planar surface. In this example, the height of a point 722 on the surface of the patterning layer 710 is 30% of the step height, A, higher than the minimum height of the surface of the patterning layer 710. Table 2 has been constructed for use with the example of FIGS. 7A, 7B and 7C according to principles similar to those used to construct Table 1. The height of the surface of the patterning layer 710 at point 722 is T+0.3*A, which falls between heights T+5*A/17 and T+6*A/17.

Table 2 indicates which mask pattern of FIG. 6 is used to construct the etch mask for region 502 surrounding the point 722, and for every similar region comprising the entire mask 500. Referring to Table 2 and to FIGS. 4 and 5, the point 722 falls into bin 5. Referring to FIG. 6, the etch mask corresponding to bin 5 allows 5/16ths of the region 502 corresponding to the location of the patterning layer 710 containing point 722 to be removed by the etching of the patterning layer. The optimal etch depth is "A," which is the difference between the greatest height represented by the highest bin (T+A in bin 16) and the lowest height represented by the lowest bin (T in bin 0). Consequently, the averaging portion 502 corresponding to the location of the patterning layer 710 containing point 722 will be etched to remove a depth "A" of material from the patterning layer over a total of 5/16ths (approximately 30%) of the total area below the averaging portion 502.

An entire mask 500 is constructed as a composite of averaging portion 502 and each similar portion by selecting a pattern from FIG. 6 that is determined by Table 2 from the height of surface 714 at each location on surface 714 associated with its corresponding region on mask 500. A mask so constructed, when used to mask the etch of layer 710 to a constant depth "A" will cause the etched surface 724 of FIG. 7B to be globally planar when the height of the surface 724 is averaged over any averaging portion 502.

TABLE 2

| Bin 0: | T to T+A/17 |
| --- | --- |
| Bin 1: | T+A/17 to T+2*A/17 |
| Bin 2: | T+2*A/17 to T+3*A/17 |
| Bin 3: | T+3*A/17 to T+4*A/17 |
| Bin 4: | T+4*A/17 to T+5*A/17 |
| Bin 5: | T+5*A/17 to T+6*A/17 |
| Bin 6: | T+6*A/17 to T+7*A/17 |
| Bin 7: | T+7*A/17 to T+8*A/17 |
| Bin 8: | T+8*A/17 to T+9*A/17 |
| Bin 9: | T+9*A/17 to T+10*A/17 |
| Bin 10: | T+10*A/17 to T+11*A/17 |
| Bin 11: | T+11*A/17 to T+12*A/17 |
| Bin 12: | T+12*A/17 to T+13*A/17 |
| Bin 13: | T+13*A/17 to T+14*A/17 |
| Bin 14: | T+14*A/17 to T+15*A/17 |
| Bin 15: | T+15*A/17 to T+16*A/17 |
| Bin 16: | T+16*A/17 to T+A |

Figure 8:
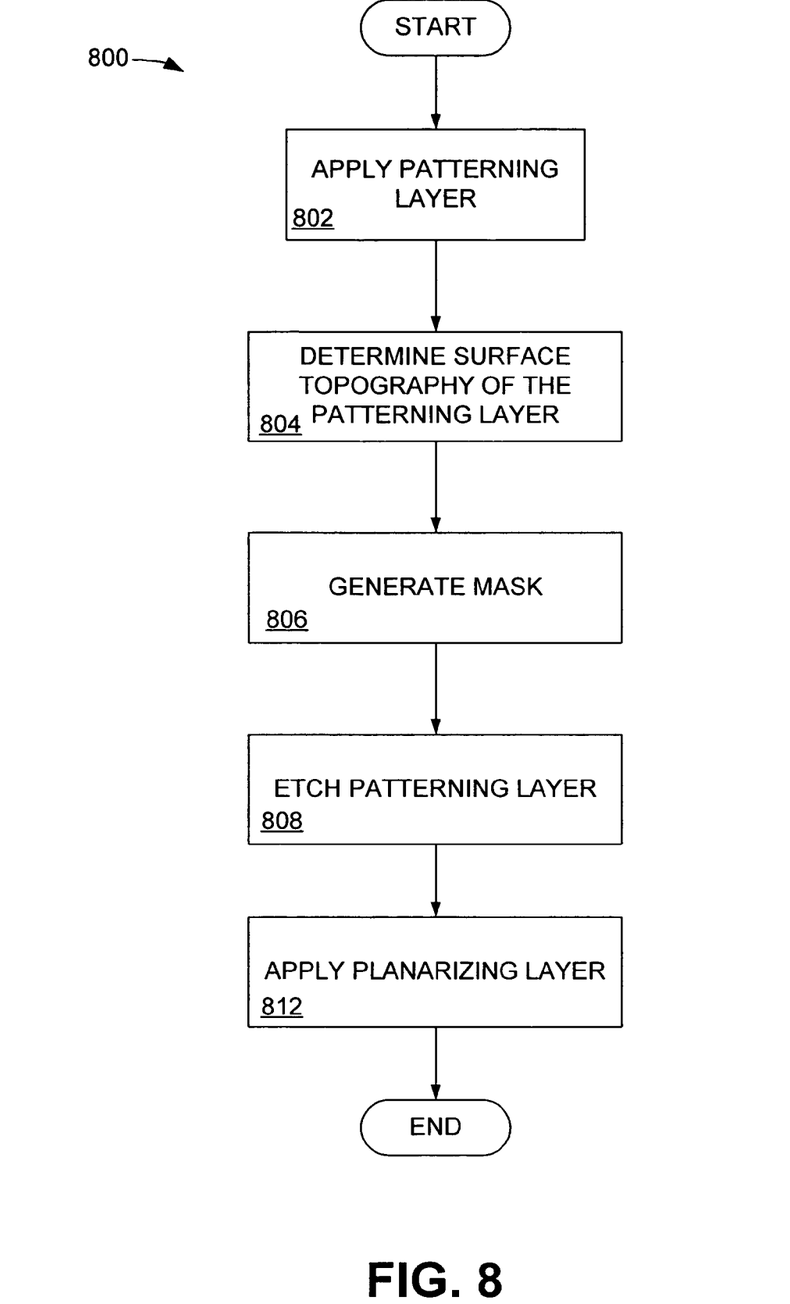
FIG. 8 is a flow chart illustrating a method of one embodiment of the invention.

FIG. 8 is a flow chart illustrating the method of one embodiment of the invention. The blocks in the flow chart of FIG. 8 can be performed in the order shown, out of the order shown, or in parallel. In block 802, a patterning layer 110 is applied over a substrate. In block 804, the surface topography of the patterning layer 110 is determined. As described above, the surface topography of the patterning layer can be calculated based on information describing the surface topography 104 of the circuitry 102 (FIG. 1A), or can be directly measured. In this embodiment, the material applied as the patterning layer 110 has a property that includes a defined relationship between its resulting surface topography 114 and the surface topography 104 of the layer over which it is applied.

In block 806, an etch mask is generated based on the localized height of the individual averaging regions 402 of the surface of the patterning layer 110 (FIG. 4). In block 808, the patterning layer 110 is etched, resulting in the surface topography 124 shown in FIG. 1B. In block 810, the planarizing layer 130 is applied over the substrate surface. The patterning layer can be applied directly over the etched patterning layer 110 or can be applied above the substrate surface.

Figure 9:
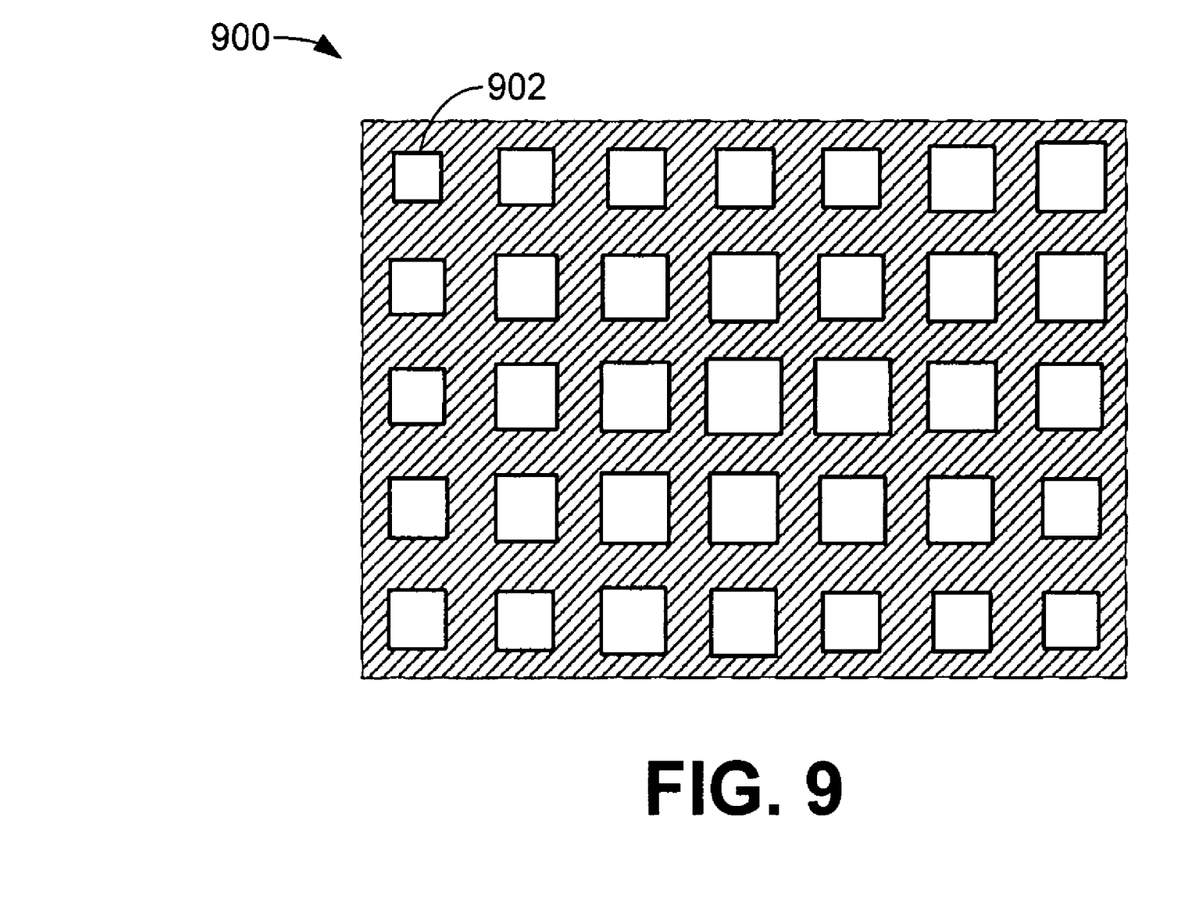
FIG. 9 is a schematic diagram illustrating an alternative embodiment of the mask of FIG. 5.

FIG. 9 is a schematic diagram illustrating an alternative embodiment of the mask 500 of FIG. 5. The mask 900 comprises a portion, an exemplary one of which is illustrated using reference numeral 902, corresponding to each of the averaging regions 402 in FIG. 4. However, instead of dividing each portion 902 into subportions 505, the mask 900 has a single opening in each portion 902. The size of the opening in each portion 902 is determined to allow the removal of an amount of material corresponding to the height of the patterning layer 110 in each averaging region 402 of FIG. 4. The size of each opening of the mask 900 in each portion 902 corresponds to the sum of the sizes of the subportions 505 opened in the mask 500 of FIG. 5.

In an alternative embodiment, a photo resist material can be used as the patterning layer 110. In this example, a photo resist is applied and the surface topography of the photo resist is determined. The photo resist is exposed using a mask and is then developed so that the average topography of the photo resist surface is planar. Then, the planarizing layer is applied over the photo resist.

In another alternative embodiment, instead of applying a planarizing layer over the photo resist described in the previous paragraph, the photo resist is re-flowed (typically by heating) to provide the low-pass two dimensional lateral filtering effect normally performed by the planarizing layer. A final planarizing layer may still be optionally applied after the reflow of the photo resist.

In another alternative embodiment, the desired modification of the surface topography of the first material layer can be achieved by selectively depositing on the first material layer in each averaging region a portion of an additional material layer having an aggregate area that depends inversely on the average height of the material layer surface in the averaging region. The planarizing layer is then applied and will have a planar surface.

In another alternative embodiment, the desired modification of the surface topography of the first material layer can be achieved by etching a constant portion of the area of each averaging region, but by adjusting the depth by which material is removed from each averaging region so that the total material removed from each averaging region depends proportionally on the average height of the material layer surface in the averaging region. The planarizing layer is then applied and will have a planar surface.

In another alternative embodiment, instead of applying the patterning layer over the entire surface of the substrate and then etching in selectively-defined subregions, the patterning layer can be applied to the substrate only in selectively-defined subregions. Any of a number of methods may be used to cause the patterning material to be so selectively applied. One such method well known in the semiconductor processing art is the so-called "photoresist lift-off" method. Another method, useable when, for example, the patterning layer is applied by an evaporative process in a vacuum chamber, would use a patterned shadow mask between the substrate and the evaporation source. After depositing the patterning layer, the planarizing layer is applied, resulting in a planar surface.

In another alternative embodiment, instead of applying a patterning layer over the surface of the substrate and etching the patterning layer, a patterned etch may be done directly on the substrate. The planarizing layer is then applied over the substrate.

This disclosure describes the invention in detail using illustrative embodiments. However, it is to be understood that the invention defined by the appended claims is not limited to the precise embodiments described.

We claim:

1. A system for planarizing a substrate surface having a non-planar surface topography, the system comprising:
   a material layer over the substrate surface, the material layer having a surface topography;
   a planarizing layer over the substrate surface, the planarizing layer providing a low-pass lateral filtering effect characterized by a characteristic length; and
   a mask configured using information relating to the surface topography of the material layer to define portions of averaging regions of the material layer for selective modification to equalize the average height of the averaging regions, the averaging regions having a maximum dimension less than the characteristic length.

2. The system of claim 1, wherein, in each averaging region, the mask defines equal-area openings, the number of which depends on the thickness of the material layer in the averaging region.

3. The system of claim 2, wherein the material layer is etched in accordance with the mask to form a surface that is locally non-planar, but is substantially planar when averaged among the averaging regions.

4. The system of claim 3, wherein, in each averaging region, the mask defines an opening having an area that depends on the average thickness of the material layer in the averaging region.

5. The system of claim 4, wherein the average height of the material layer in each averaging region is measured.

6. The system of claim 4, wherein the average height of the material layer in each averaging region is calculated.

7. The system of claim 2, wherein the material layer is thickened in accordance with the mask to form a surface that is locally non-planar but is planar when averaged among the averaging regions.

8. The system of claim 7, wherein, in each averaging region, the mask defines an opening having an area that depends on the average thickness of the material layer in the averaging region.

9. A method for planarizing a substrate surface having a non-planar surface topography, the method comprising:
   forming a material layer over the substrate, the material layer having a surface topography;
   determining the surface topography of the material layer;
   forming a mask using information relating to the surface topography of the material layer, the mask defining portions of averaging regions of the material layer for selective removal to equalize the averaging regions in average height, the averaging regions having a maximum dimension;
   etching the material layer using the mask; and
   forming a planarizing layer over the substrate surface, the planarizing layer providing a low-pass lateral filtering effect characterized by a characteristic length greater than the maximum dimension of the averaging region.

10. The method of claim 9, wherein determining the surface topography of the material layer comprises:
    determining the surface topography of the substrate; and
    calculating the surface topography of the first material layer from the surface topography of the substrate.

11. The method of claim 10, wherein the surface topography of the material layer has a defined relationship to the surface topography of the substrate.

12. The method of claim 11, wherein forming the mask further comprises:
    determining the average height of the material layer in each averaging region with respect to the substrate; and
    in each averaging region, defining a number of equal-area openings in the mask, the number of openings depending on the average height of the material layer in the averaging region.

13. The method of claim 12, further comprising etching the material layer using the mask, the etching providing the material layer with a surface topology that is locally non-planar in each averaging region, but is substantially planar when averaged among the averaging regions.

14. The method of claim 11, wherein forming the mask further comprises:
    determining the average height of the material layer in each averaging region with respect to the substrate; and
    in each averaging region, defining at least one opening in the mask, the at least one opening having an aggregate area that depends on the average height of the material layer in the averaging region.

15. The method of claim 14, further comprising etching the material layer using mask, the etching providing the material layer with a surface topology that is locally non-planar in each region, but is substantially planar when averaged among the averaging regions.

16. The method of claim 11, wherein forming the planarizing layer comprises reflowing the etched material layer.

17. A method for planarizing a substrate surface having a non-planar surface topology, the method comprising:
    providing a planarizing material having a low-pass lateral filtering effect characterized by a characteristic length;
    forming a material layer over the substrate, the material layer having a surface having a surface topology, the surface comprising averaging regions characterized by a maximum dimension smaller than the characteristic length;
    modifying the surface topology of the material layer to one that is non-planar in each averaging region, but is planar when averaged over the averaging regions; and
    forming over the substrate surface a planarizing layer of the planarizing material.

18. The method of claim 17, wherein the modifying comprises, in each averaging region, forming a number of equal-area cavities in the material layer, the number of cavities depending on the average height above the substrate surface of the surface of the material layer in the averaging region.

19. The method of claim 18, additionally comprising measuring the average height above the substrate surface of the surface of the material layer in the averaging region.

20. The method of claim 18, additionally comprising calculating the average height above the substrate surface of the surface of the material layer in the averaging region.

21. The method of claim 20, in which the calculating comprises calculating the average height above the substrate surface of the surface of the material layer in the averaging region from the surface topology of the substrate surface.

22. The method of claim 17, wherein the modifying comprises, in each averaging region, forming at least one cavity in the material layer, the at least one cavity having an aggregate area that depends on the average height above the substrate surface of the surface of the material layer in the averaging region.

23. The method of claim 17, wherein the modifying comprises, in each averaging region, depositing at least one portion of an additional material layer on the material layer, the at least one portion of the additional material layer having an aggregate area inversely depending on the average height above the substrate surface of the surface of the material layer in the averaging region.

24. The method of claim 17, wherein forming the planarizing layer comprises reflowing the modified material layer.

25. A method for planarizing a substrate surface having a non-planar surface topology, the method comprising:

providing a planarizing material having a low-pass lateral filtering effect characterized by a characteristic length;

providing a substrate having a surface topology, the surface comprising averaging regions characterized by a maximum dimension smaller than the characteristic length;

modifying the surface topology of the substrate to one that is non-planar in each averaging region, but is planar when averaged over the averaging regions; and forming over the substrate surface a planarizing layer of the planarizing material.

* * * * *